(12) United States Patent
Muraoka et al.

(10) Patent No.: US 11,923,123 B2
(45) Date of Patent: Mar. 5, 2024

(54) MULTILAYER SUBSTRATE AND A MANUFACTURING METHOD OF THE MULTILAYER SUBSTRATE

(71) Applicant: Murata Manufacturing Co., Ltd., Nagaokakyo (JP)

(72) Inventors: Kazutaka Muraoka, Nagaokakyo (JP); Kuniaki Yosui, Nagaokakyo (JP); Yuki Ito, Nagaokakyo (JP); Naoki Gouchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1241 days.

(21) Appl. No.: 16/166,225

(22) Filed: Oct. 22, 2018

(65) Prior Publication Data

US 2019/0057803 A1 Feb. 21, 2019

Related U.S. Application Data

(63) Continuation of application No. PCT/JP2017/017125, filed on May 1, 2017.

(30) Foreign Application Priority Data

May 19, 2016 (JP) ................... 2016-100033

(51) Int. Cl.
*H01F 27/28* (2006.01)
*H01F 17/00* (2006.01)
(Continued)

(52) U.S. Cl.
CPC ..... *H01F 27/2804* (2013.01); *H01F 17/0013* (2013.01); *H01F 41/041* (2013.01);
(Continued)

(58) Field of Classification Search
CPC ......... H01F 27/2804; H01F 2027/2809; H01F 17/0013; H01F 17/0006; H01F 5/003;
(Continued)

(56) References Cited

U.S. PATENT DOCUMENTS 4,613,843 A * 9/1986 Esper ................ H02K 3/26
336/200
6,051,448 A 4/2000 Hayama et al.
(Continued)

FOREIGN PATENT DOCUMENTS

CN 102169868 A * 8/2011
JP 58-201391 A 11/1983
(Continued)

OTHER PUBLICATIONS

Official Communication issued in International Patent Application No. PCT/JP2017/017125, dated Aug. 1, 2017.

*Primary Examiner* — Tszfung J Chan
(74) *Attorney, Agent, or Firm* — Keating & Bennett, LLP

(57) ABSTRACT

A multilayer substrate includes first and second insulating layers stacked in a stacking direction with the second insulating layer located at a first side of the first insulating layer in the stacking direction, a first coil pattern disposed on a first principal surface of the first insulating layer on the first side of the first insulating layer in the stacking direction, and a second coil pattern disposed on a first principal surface of the second insulating layer on the first side of the second insulating layer in the stacking direction. The first and second coil patterns have spiral shapes. When viewed from the layer stacking direction, at least a portion of a first area in which the first coil pattern is disposed and at least a portion of a second area in which the second coil pattern is disposed overlap each other.

4 Claims, 17 Drawing Sheets

(51) Int. Cl.
*H01F 41/04* (2006.01)
*H05K 1/16* (2006.01)
*H05K 3/18* (2006.01)
*H05K 3/46* (2006.01)
*H01F 27/29* (2006.01)
*H05K 1/02* (2006.01)
*H05K 1/11* (2006.01)
*H05K 3/00* (2006.01)
*H05K 3/24* (2006.01)
*H05K 3/40* (2006.01)

(52) U.S. Cl.
CPC ........... *H01F 41/043* (2013.01); *H05K 1/165* (2013.01); *H05K 3/188* (2013.01); *H05K 3/4644* (2013.01); *H05K 3/4661* (2013.01); *H01F 2027/2809* (2013.01); *H01F 27/29* (2013.01); *H01F 27/292* (2013.01); *H05K 1/0271* (2013.01); *H05K 1/0296* (2013.01); *H05K 1/115* (2013.01); *H05K 3/0032* (2013.01); *H05K 3/241* (2013.01); *H05K 3/4038* (2013.01); *H05K 2201/0154* (2013.01); *H05K 2203/0723* (2013.01); *H05K 2203/107* (2013.01)

(58) Field of Classification Search
CPC ....... H01F 27/29; H01F 27/292; H03K 3/188; H05K 1/165; H05K 3/4661; H05K 2203/0723
USPC .................................................. 336/200, 232
See application file for complete search history.

(56) References Cited

U.S. PATENT DOCUMENTS

| | | | |
|---|---|---|---|
| 7,397,334 B2 * | 7/2008 | Yoshida | H01F 17/0013 336/200 |
| 8,193,781 B2 * | 6/2012 | Lin | H02K 35/02 336/200 |
| 2009/0256668 A1 | 10/2009 | Noma et al. | |
| 2013/0106554 A1 * | 5/2013 | Girard | H01F 5/003 336/200 |
| 2013/0113595 A1 | 5/2013 | Otsubo | |
| 2014/0110821 A1 * | 4/2014 | Barry | H01L 28/10 257/E29.325 |
| 2015/0028988 A1 * | 1/2015 | Yamauchi | H01F 27/2804 336/200 |
| 2015/0170827 A1 * | 6/2015 | Tsukahara | H05K 1/162 336/170 |
| 2016/0049237 A1 | 2/2016 | Yosui | |
| 2016/0314892 A1 | 10/2016 | Fukushima et al. | |

FOREIGN PATENT DOCUMENTS

| | | | |
|---|---|---|---|
| JP | 05036532 A | * | 2/1993 |
| JP | 09-330843 A | | 12/1997 |
| JP | 11097243 A | * | 4/1999 |
| JP | 5839535 B2 | | 1/2016 |
| KR | 2014137306 A | * | 12/2014 |
| KR | 20140137306 A | * | 12/2014 |
| WO | 2009/081865 A1 | | 7/2009 |
| WO | 2012/002133 A1 | | 1/2012 |
| WO | 2015/005161 A1 | | 1/2015 |
| WO | 2015/107922 A1 | | 7/2015 |

\* cited by examiner

MULTILAYER SUBSTRATE AND A MANUFACTURING METHOD OF THE MULTILAYER SUBSTRATE

CROSS REFERENCE TO RELATED APPLICATIONS

This application claims the benefit of priority to Japanese Patent Application No. 2016-100033 filed on May 19, 2016 and is a Continuation Application of PCT Application No. PCT/JP2017/017125 filed on May 1, 2017. The entire contents of each application are hereby incorporated herein by reference.

BACKGROUND OF THE INVENTION

1. Field of the Invention

The present invention relates to a multilayer substrate and a manufacturing method of the multilayer substrate, and more particularly, to a multilayer substrate including a coil pattern, and a manufacturing method of the multilayer substrate.

2. Description of Related Art

As a past invention relating to a conventional multilayer substrate, for example, a planar coil disclosed in Japanese Patent No. 5839535 is known. The planar coil includes two resin layers and two wirings. The two resin layers are stacked on each other in an up-down direction. The two wirings are disposed in the respective two resin layers and are formed by plating. When viewed from above, each of the two wirings has a spiral shape, and the two wirings are positioned in an area to overlap each other. The centers of the respective wirings are connected to each other.

In the planar coil disclosed in Japanese Patent No. 5839535, the wirings are formed by plating. The wirings formed by plating have great thicknesses. Since the two wirings overlap each other when viewed from above, there is a great difference in thickness (dimension in the up-down direction) between the area where the two wirings are positioned and another area where the wirings are not positioned. Accordingly, the planar coil is likely to have great unevenness on the upper or lower surface.

SUMMARY OF THE INVENTION

Preferred embodiments of the present invention provide multilayer substrates each of which is prevented from having unevenness on a principal surface and manufacturing methods of multilayer substrates.

A multilayer substrate according to a preferred embodiment of the present invention includes an element assembly including a first insulating layer and a second insulating layer which are stacked in layers in a layer stacking direction such that the second insulating layer is located at a first side of the first insulating layer with respect to the layer stacking direction; a first coil pattern disposed on a first principal surface of the first insulating layer, the first principal surface being on the first side of the first insulating layer with respect to the layer stacking direction; and a second coil pattern disposed on a first principal surface of the second insulating layer, the first principal surface being on the first side of the second insulating layer with respect to the layer stacking direction; wherein each of the first coil pattern and the second coil pattern has a two-dimensional spiral shape or a three-dimensional spiral shape which includes turns when viewed from the layer stacking direction; when viewed from the layer stacking direction, at least a portion of a first area in which the first coil pattern is disposed and at least a portion of a second area in which the second coil pattern is disposed overlap each other; a maximum thickness of the second coil pattern is smaller than a maximum thickness of the first coil pattern; when viewed from the layer stacking direction, each of the first coil pattern and the second coil pattern has a two-dimensional spiral shape; when viewed from the layer stacking direction, the second coil pattern includes an overlapping portion which overlaps the first coil pattern or includes a portion which is located between two radially adjacent portions of the first coil pattern; an imaginary line is defined by connecting points at which the thickness of the first coil pattern reaches a maximum in cross-sectional views of the first coil pattern along lines perpendicular or substantially perpendicular to a direction in which the first coil pattern extends; and when viewed from the layer stacking direction, an outermost portion of the imaginary line does not overlap the second coil pattern.

A multilayer substrate according to a preferred embodiment of the present invention includes an element assembly including a first insulating layer and a second insulating layer which are stacked in layers in a layer stacking direction such that the second insulating layer is located at a first side of the first insulating layer with respect to the layer stacking direction; a first coil pattern disposed on a first principal surface of the first insulating layer, the first principal surface being on the first side of the first insulating layer with respect to the layer stacking direction; and a second coil pattern disposed on a first principal surface of the second insulating layer, the first principal surface being on the first side of the second insulating layer with respect to the layer stacking direction; wherein each of the first coil pattern and the second coil pattern has a two-dimensional spiral shape or a three-dimensional spiral shape which includes turns when viewed from the layer stacking direction; when viewed from the layer stacking direction, at least a portion of a first area in which the first coil pattern is disposed and at least a portion of a second area in which the second coil pattern is disposed overlap each other; a maximum thickness of the second coil pattern is smaller than a maximum thickness of the first coil pattern; when viewed from the layer stacking direction, each of the first coil pattern and the second coil pattern has a two-dimensionally spiral shape; when viewed from the layer stacking direction, the second coil pattern includes an overlapping portion which overlaps the first coil pattern or includes a portion which is located between two radially adjacent portions of the first coil pattern; an imaginary line is defined by connecting points at which the thickness of the first coil pattern reaches a maximum in cross-sectional views of the first coil pattern along lines perpendicular or substantially perpendicular to a direction in which the first coil pattern extends; and when viewed from the layer stacking direction, the imaginary line does not overlap the second coil pattern in a portion at which the imaginary line runs side by side with the second coil pattern.

A multilayer substrate according to a preferred embodiment of the present invention includes an element assembly including a first insulating layer and a second insulating layer which are stacked in layers in a layer stacking direction such that the second insulating layer is located at a first side of the first insulating layer with respect to the layer stacking direction; a first coil pattern disposed on a first principal surface of the first insulating layer, the first principal surface being on the first side of the first insulating layer with respect to the layer stacking direction; and a second coil pattern disposed on a first principal surface of the second insulating layer, the first principal surface being on the first side of the second insulating layer with respect to the layer stacking direction; wherein each of the first coil pattern and the second coil pattern has a two-dimensional spiral shape or a three-dimensional spiral shape which includes turns when viewed from the layer stacking direction; when viewed from the layer stacking direction, at least a portion of a first area in which the first coil pattern is disposed and at least a portion of a second area in which the second coil pattern is disposed overlap each other; a maximum thickness of the second coil pattern is smaller than a maximum thickness of the first coil pattern; and a line width of the first coil pattern is smaller than a line width of the second coil pattern.

A multilayer substrate according to a preferred embodiment of the present invention includes an element assembly including a first insulating layer and a second insulating layer which are stacked in layers in a layer stacking direction such that the second insulating layer is located at a first side of the first insulating layer with respect to the layer stacking direction; a first coil pattern disposed on a first principal surface of the first insulating layer, the first principal surface being on the first side of the first insulating layer with respect to the layer stacking direction; and a second coil pattern disposed on a first principal surface of the second insulating layer, the first principal surface being on the first side of the second insulating layer with respect to the layer stacking direction; wherein each of the first coil pattern and the second coil pattern has a two-dimensional spiral shape or a three-dimensional spiral shape which includes turns when viewed from the layer stacking direction; when viewed from the layer stacking direction, at least a portion of a first area in which the first coil pattern is disposed and at least a portion of a second area in which the second coil pattern is disposed overlap each other; a maximum thickness of the second coil pattern is smaller than a maximum thickness of the first coil pattern; and an interval between lines of the first coil pattern is smaller than an interval between lines of the second coil pattern.

A method for manufacturing a multilayer substrate according to a preferred embodiment of the present invention includes forming a first coil pattern, which includes a plated layer grown by electroplating, on a first principal surface of a first insulating layer, the first principal surface being on a first side of the first insulating layer with respect to a layer stacking direction; forming a second coil pattern by patterning a metal film disposed on a first principal surface of a second insulating layer, the first principal surface being on the first side of the second insulating layer with respect to the layer stacking direction; and stacking the first insulating layer and the second insulating layer in layers such that the second insulating layer is located at the first side of the first insulating layer with respect to the layer stacking direction; wherein each of the first coil pattern and the second coil pattern has a two-dimensional spiral shape or a three-dimensional spiral shape which includes turns when viewed from the layer stacking direction; when viewed from the layer stacking direction, at least a portion of a first area in which the first coil pattern is disposed and at least a portion of a second area where the second coil pattern is disposed overlap each other; and a maximum thickness of the second coil pattern is smaller than a maximum thickness of the first coil pattern.

Preferred embodiments of the present invention reduce or prevent multilayer substrates from having unevenness on principal surfaces.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Multilayer substrates and manufacturing methods of multilayer substrates according to preferred embodiments of the present invention will hereinafter be described with reference to the drawings.

Figure 1:
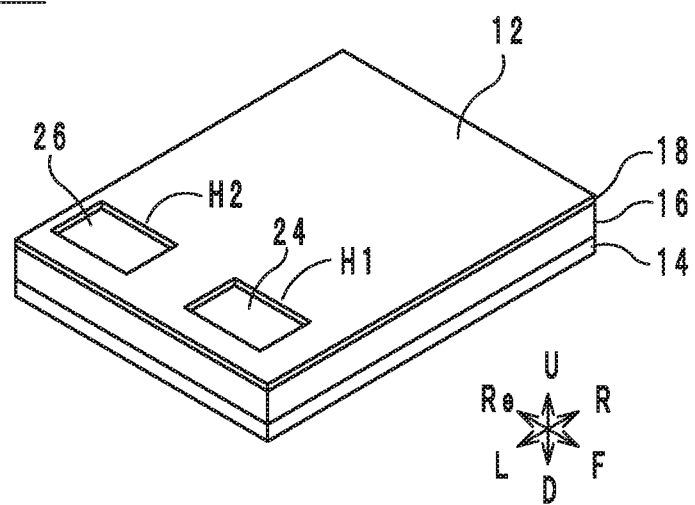
FIG. 1 is a perspective view showing the external appearance of multilayer substrates 10, 10a, 10b and 10e according to preferred embodiments of the present invention.
Figure 2:
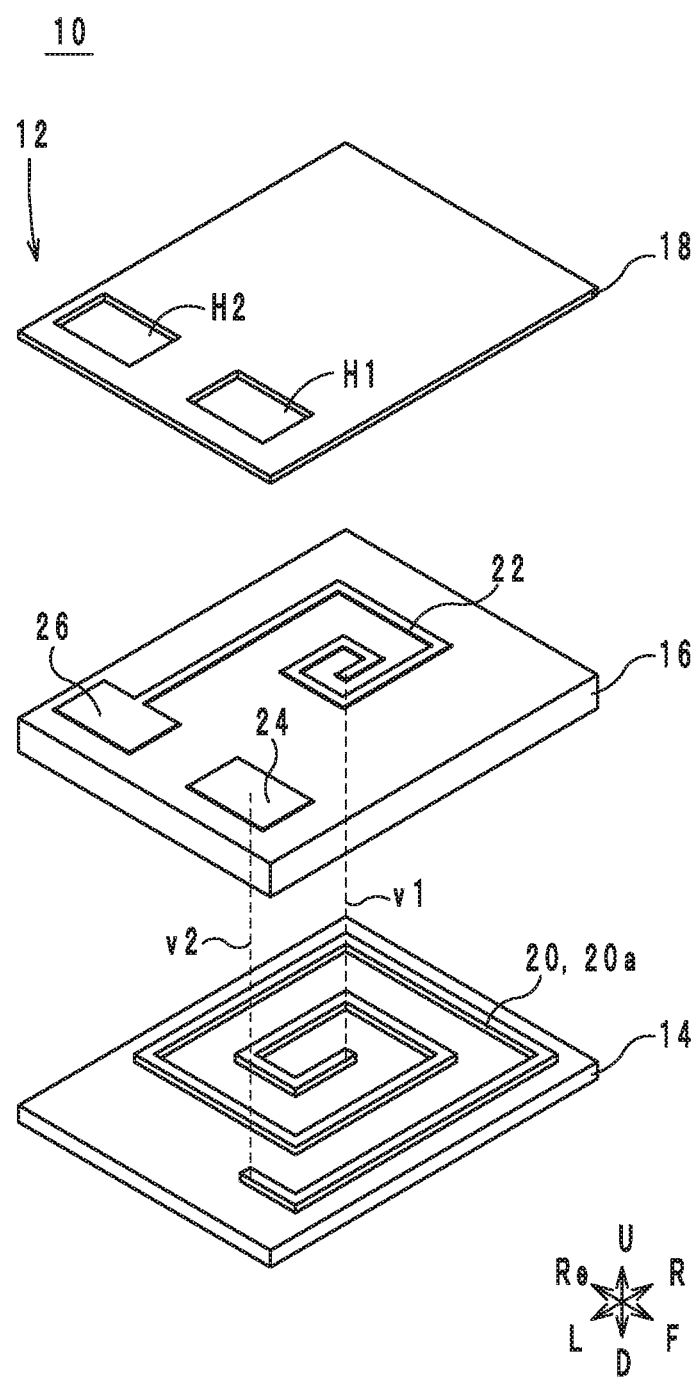
FIG. 2 is an exploded perspective view of the multilayer substrate 10 according to a preferred embodiment of the present invention.
Figure 3:
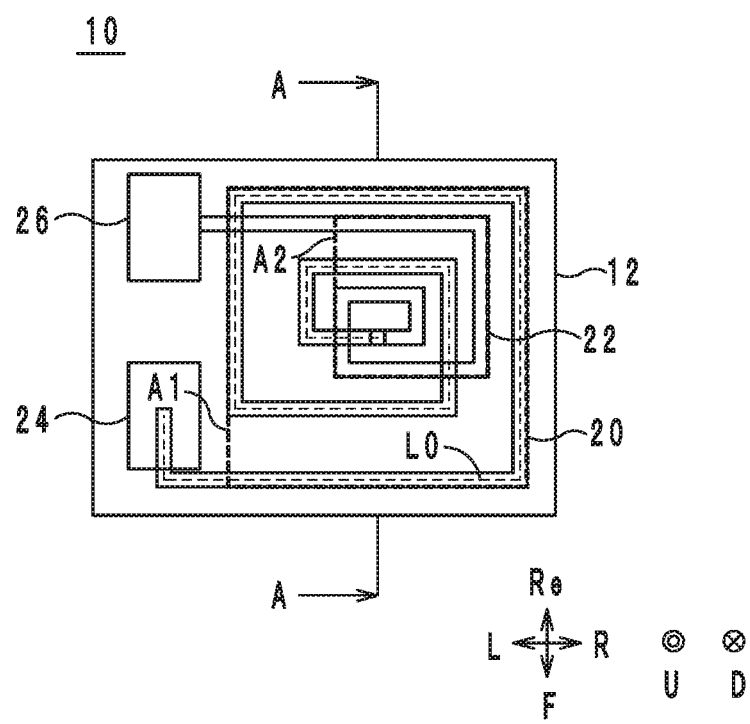
FIG. 3 is a top transparent view of the multilayer substrates 10, 10a, 10b and 10e.
Figure 4:
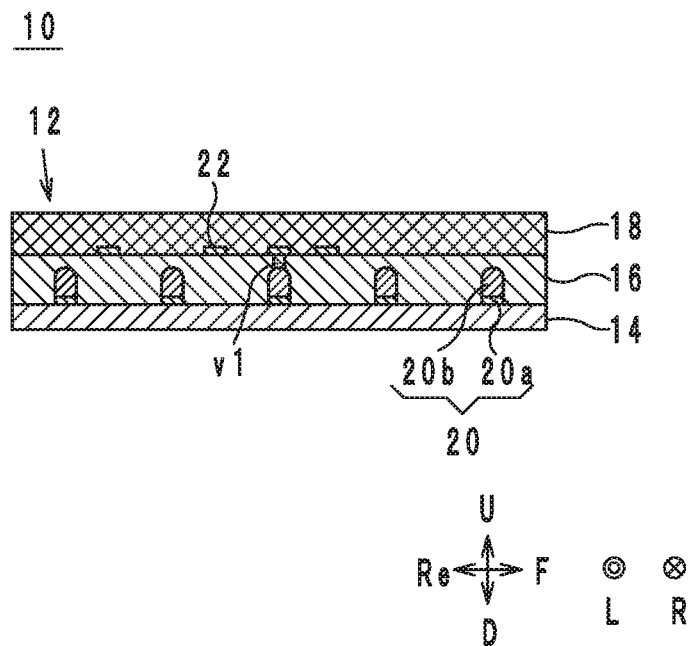
FIG. 4 is a sectional view of the multilayer substrate 10 along the line A-A in FIG. 3.

The structure of a multilayer substrate according to a preferred embodiment of the present invention will be described below with reference to the drawings. FIG. 1 is a perspective view showing the external appearance of multilayer substrates 10, 10a, 10b and 10e. FIG. 2 is an exploded perspective view of the multilayer substrate 10. FIG. 3 is a top transparent view of the multilayer substrate 10. FIG. 3 shows coil patterns 20 and 22, and external electrodes 24 and 26. FIG. 4 is a sectional view of the multilayer substrate 10 along the line A-A in FIG. 3. In the following description, the direction in which layers of the multilayer substrate 10 are stacked on one another will be referred to as an up-down direction. When the multilayer substrate 10 is viewed from the up-side direction, a direction in which long sides extend will be referred to as a right-left direction, and a direction in which short sides extend will be referred to as a front-rear direction. The up-down direction, the right-left direction and the front-rear direction are perpendicular or substantially perpendicular to one another. The up-down direction, the right-left direction and the front-rear direction are merely examples, and the up-down direction, the right-left direction and the front-rear direction need not coincide with the up-down direction, the right-left direction and the front-rear direction when the multilayer substrate 10 is used.

The multilayer substrate 10 is used, for example, in a cell-phone or any other electronic device. The multilayer substrate 10, as shown in FIGS. 1 to 4, includes an element assembly 12, coil patterns 20 and 22, via-hole conductors v1 and v2, and external electrodes 24 and 26.

The element assembly 12 is preferably a plate-shaped member which is rectangular or substantially rectangular when viewed from above, and is flexible. When the element assembly 12 is viewed from above, the long sides thereof extend in the right-left direction. When the element assembly 12 is viewed from above, the short sides thereof extend in the front-rear direction. However, this shape of the element assembly 12 is an example, and the shape of the element assembly 12 is not limited to the example.

The element assembly 12 includes insulating layers 14 and 16, and a protective layer 18. The insulating layers 14 and 16, and the protective layer 18 are stacked in layers from bottom to top in this order. Accordingly, in the element assembly 12, the insulating layer 16 (an example of a second insulating layer) is located at an upper side (an example of a first side with respect to the layer stacking direction) of the insulating layer 14 (an example of a first insulating layer). The insulating layer 14 is preferably made of polyimide, for example. The insulating layer 16 and the protective layer 18 are preferably made of epoxy resin (resist), for example. These materials are examples, and the materials of the insulating layers 14 and 16, and the protective layer 18 are not limited to the examples. The protective layer 18 need not be provided.

The coil pattern 20 (an example of a first coil pattern) is disposed on an upper surface of the insulating layer 14 (an example of a first principal surface on the first side of the first insulating layer with respect to the layer stacking direction), and the coil pattern 20 spirals from outside inward in counterclockwise turns (and thus, has a two-dimensional spiral shape). When the coil pattern 20 is viewed from above, the outer shape thereof is preferably rectangular or substantially rectangular, for example. When the element assembly 12 is viewed from above, the inner end of the coil pattern 20 is positioned near the intersection between diagonal lines of the upper surface of the insulating layer 14. Also, when the element assembly 12 is viewed from above, the outer end of the coil pattern 20 is positioned near the left front corner of the insulating layer 14. The coil pattern 20 has a length of about two turns.

The coil pattern 20, as shown in FIG. 4, includes an underlayer conductor 20a and a plated layer 20b. The underlayer conductor 20a is a conductor layer provided directly on the upper surface of the insulating layer 14. In a cross-sectional view of the underlayer conductor 20a along a line perpendicular or substantially perpendicular to the direction in which the coil pattern 20 extends, the underlayer conductor 20a has a uniform or substantially uniform thickness. In this specification, a thickness means the dimension of a conductor layer or an insulating layer in the up-down direction. The underlayer conductor 20a is preferably made of Cu, for example. The plated layer 20b is a conductor layer provided on the underlayer conductor 20a. The plated layer 20b is preferably grown by, for example, electroplating with the underlayer conductor 20a used as a base electrode. In a cross-sectional view of the plated layer 20b along a line perpendicular or substantially perpendicular to the direction in which the coil pattern 20 extends, the thickness of the plated layer 20b reaches a maximum in the vicinity of the center in the line width direction. In the cross-sectional view of the plated layer 20b along a line perpendicular to the direction in which the coil pattern 20 extends, the thickness of the plated layer 20b becomes smaller with increasing distance from the vicinity of the center in the line width direction. The line width direction is a direction perpendicular or substantially perpendicular to the direction in which the coil pattern 20 extends when the coil pattern 20 is viewed from above. The maximum thickness of the plated layer 20b is greater than the maximum thickness of the underlayer conductor 20a. Since the plated layer 20b is grown on the underlayer conductor 20a by electroplating, the plated layer 20a has a large thickness (a large dimension in the up-down direction). Accordingly, as compared to a plated layer formed by patterning a thin metal film formed by plating, the plated layer 20b has a large thickness. The plated layer 20b is preferably made of Cu, for example. However, this material is an example, and the material of the underlayer conductor 20a and the plated layer 20b is not limited to the example.

The coil pattern 22 (an example of a second coil pattern) is disposed on an upper surface of the insulating layer 16 (an example of a first principal surface on the first side of the second insulating layer with respect to the layer stacking direction), and the coil pattern 22 spirals from inside outward in counterclockwise turns (and thus has a two-dimensional spiral shape). When the coil pattern 22 is viewed from above, the outer shape thereof is preferably rectangular or substantially rectangular. When the element assembly 12 is viewed from above, the inner end of the coil pattern 22 is positioned near the intersection between diagonal lines of the upper surface of the insulating layer 16. Also, when the element assembly 12 is viewed from above, the outer end of the coil pattern 22 is positioned near the left rear corner of the insulating layer 16. The coil pattern 22 has a length of about one and a half turns.

The coil pattern 22 is a conductor layer provided directly on an upper surface of the insulating layer 16. The coil pattern 22 is preferably made of Cu, for example. However, this material is an example, and the material of the coil pattern 22 is not limited to the example. The thickness of the coil pattern 22 is uniform or substantially uniform. The maximum thickness of the coil pattern 22 is smaller than the maximum thickness of the coil pattern 20. Accordingly, the non-uniformity of the coil pattern 22 in the dimension in the up-down direction is smaller than the non-uniformity of the coil pattern 20 in the dimension in the up-down direction. The non-uniformity means the difference between the maximum thickness and the minimum thickness of the coil pattern 20 or 22.

In reference to FIG. 3, the positional relationship between the coil pattern 20 and the coil pattern 22 will be described in detail. The area in which the coil pattern 20 is disposed is referred to as an area A1 (an example of a first area). The area in which the coil pattern 22 is disposed is referred to as an area A2 (an example of a second area). The areas A1 and A2 are enclosed by the outermost rings of the coil patterns 20 and 22, respectively. To be exact, since the coil patterns 20 and 22 are spiral-shaped, the areas enclosed by the outermost rings of the coil patterns 20 and 22 are not closed spaces. In the present preferred embodiment, however, rectangular spaces defined by connecting unconnected portions of the respective outer rings of the coil patterns 20 and 22 by imaginary lines are referred to as areas enclosed by the outermost rings of the coil patterns 20 and 22, for convenience.

When viewed from above, the area A1 and the area A2 overlap each other. In the present preferred embodiment, when the areas A1 and A2 are viewed from above, the area A2 is within the area A1. How the area A1 and the area A2 overlap is not limited to this, and it is only required that at least a portion of the area A1 and at least a portion of the area A2 overlap each other when the areas A1 and A2 are viewed from above. Also, the areas A1 and A2 preferably overlap each other, and the coil patters 20 and 22 preferably do not overlap each other.

As shown in FIG. 3, when the coil pattern 22 is viewed from above, the coil pattern 22 includes a portion positioned between radially adjacent portions of the coil pattern 20. The radially adjacent portions means adjacent portions with respect to the direction from the inner side of the coil pattern 20 to the outer side of the coil pattern 20. Specifically, as shown in FIG. 4, when viewed from above, the coil pattern 22 includes portions positioned between adjacent portions of the coil pattern 20. The coil pattern 20 spirals from outside inward in counterclockwise turns when viewed from above. On the other hand, the coil pattern spirals from inside outward in counterclockwise turns when viewed from above. Therefore, the coil pattern 20 and the coil pattern 22 include one or more overlap portions (to be more exact, intersections) when viewed from above.

A line provided by connecting the points at which the thickness reaches a maximum in cross-sectional views of the coil pattern 20 along lines in a direction perpendicular or substantially perpendicular to the direction in which the coil pattern 20 extends is defined as an imaginary line LO. The imaginary line LO is, when viewed from above, positioned in the center or approximate center of the coil pattern 20 with respect to the line width direction and has a spiral shape. The imaginary line LO, when viewed from above, does not overlap the coil pattern 22 in an area at which the imaginary line LO and the coil pattern 22 run side by side. Running side by side means that two linear objects extend keeping a constant or substantially constant distance from each other. More specifically, each of the coil patterns 20 and 22 is formed into a spiral shape by connecting a line extending in front-rear direction and a line extending in left-right direction. Therefore, the coil pattern 20 (imaginary line LO) and the coil pattern 22 include portions running side by side. In each portion at which the coil pattern 20 and the coil pattern 22 run side by side when viewed from above, there is a space between the coil pattern 20 and the coil pattern 22. Accordingly, the imaginary line LO does not overlap the coil pattern 22 in the portion at which the imaginary line LO runs side by side with the coil pattern 22. Further, the coil pattern 20 does not overlap the coil pattern 22 in the portion at which the coil pattern 20 runs side by side with the coil pattern 22.

The via-hole conductor v1 extends through the insulating layer 16 in the up-down direction to connect the inner end of the coil pattern 20 and the inner end of the coil pattern 22. Thus, the coil pattern 20 and the coil pattern 22 are electrically connected in series. Therefore, the coil patterns 20 and 22, and the via-hole conductor v1 define one coil. The via-hole conductor v1 is preferably made of Cu, Sn, Ag or other suitable material, for example. These materials are examples, and the material of the via-hole conductor v1 is not limited to these examples.

The external electrode 24 is disposed on the upper surface of the insulating layer 16 and preferably has a rectangular or substantially rectangular shape when viewed from above. The external electrode 24 is positioned near the left front corner of the upper surface of the insulating layer 16. When viewed from above, the protective layer 18 preferably has a rectangular or substantially rectangular through-hole H1 at the left front corner. Accordingly, the external electrode 24 is exposed on the outside through the through-hole H1, and the external electrode 24 is connectable with an exterior circuit. The external electrode 24 preferably has a uniform or substantially uniform thickness.

The external electrode 26 is disposed on the upper surface of the insulating layer 16, and preferably has a rectangular or substantially rectangular shape when viewed from above. The external electrode 26 is positioned near the left rear corner of the upper surface of the insulating layer 16. When viewed from above, the protective layer 18 preferably has a rectangular or substantially rectangular through-hole H2 at the left rear corner. Accordingly, the external electrode 26 is exposed on the outside through the through-hole H2, and the external electrode 26 is connectable with an exterior circuit. The external electrode 26 preferably has a uniform or substantially uniform thickness. The outer end of the coil pattern 22 is connected to the external electrode 26. The external electrodes 24 and 26 are preferably made of Cu, for example. This material is an example, and the material of the external electrodes 24 and 26 is not limited to the example.

The via-hole conductor v2 extends through the insulating layer 16 in the up-down direction to connect the outer end of the coil pattern 20 and the external electrode 24. Thus, the coil pattern 20 and the external electrode 24 are electrically connected. The via-hole conductor v2 is preferably made of Cu, Sn, Ag or other suitable material, for example. These materials are examples, and the material of the via-hole conductor v2 is not limited to these examples.

A manufacturing method of the multilayer substrate 10 will hereinafter be described with reference to the drawings.

FIGS. 5A to 5G are sectional views showing a manufacturing process of the multilayer substrate 10. In the following, a case of manufacturing one multilayer substrate 10 will be described as an example. Practically, however, large-sized insulating sheets are stacked and cut, and thus, a plurality of multilayer substrates 10 are manufactured at the same time.

Figure 5A:
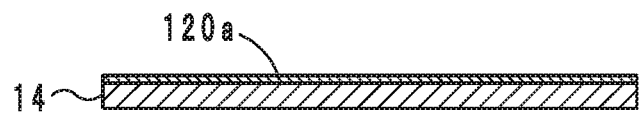
FIG. 5A is a sectional view showing a step of a manufacturing process of the multilayer substrate 10.
Figure 5A:
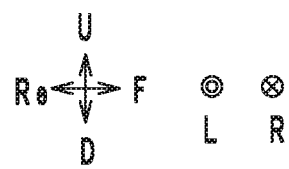

First, as shown in FIG. 5A, preferably, an insulating layer which is made of polyimide film and includes an upper surface entirely or substantially entirely covered with a Cu foil 120a (an example of a metal film) is prepared as the insulating layer 14. The Cu foil 120a may be formed, for example, by providing a thin metal foil of Cu on the upper surface of the insulating layer 14 or by forming a metal film of Cu on the upper surface of the insulating layer 14 by plating or other suitable process.

Figure 5B:
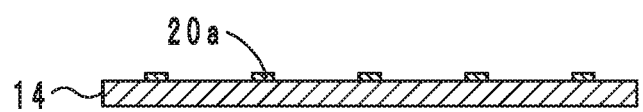
FIG. 5B is a sectional view showing a step of the manufacturing process of the multilayer substrate 10.
Figure 5B:
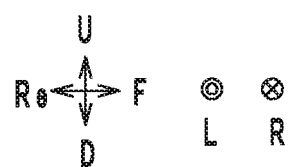

Next, as shown in FIG. 5B, the Cu foil 120a on the upper surface of the insulating layer 14 is patterned, and thus, the underlayer conductor 20a is formed. Specifically, on the Cu foil 120a, a resist having the same or substantially the same shape as the coil pattern 20 shown in FIG. 2 is printed. Next, the Cu foil 120a is etched, and the portion of the Cu foil 120a uncovered with the resist is removed. Thereafter, the resist is removed. In this manner, the underlayer conductor 20a as shown in FIG. 2 is formed on the insulating layer 14.

Figure 5C:
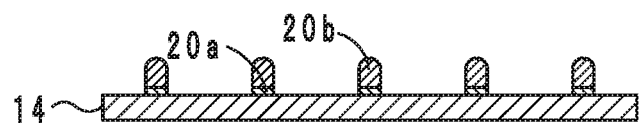
FIG. 5C is a sectional view showing a step of the manufacturing process of the multilayer substrate 10.
Figure 5C:
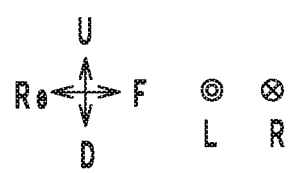

Next, as shown in FIG. 5C, preferably, the plated layer 20b is formed by Cu electroplating, for example, with the underlayer conductor 20a used as a base electrode. Thus, the coil pattern 20 including the plated layer 20b is formed on the upper surface of the insulating layer 14.

Figure 5D:
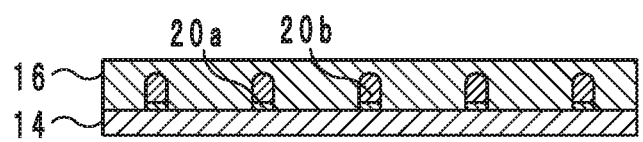
FIG. 5D is a sectional view showing a step of the manufacturing process of the multilayer substrate 10.
Figure 5D:
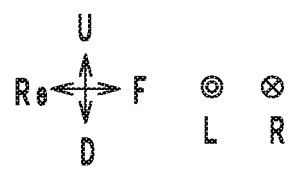

Next, as shown in FIG. 5D, preferably, epoxy resin, for example, is applied to cover the upper surface of the coil pattern 20 and the insulating layer 14, and thus, the insulating layer 16 is formed. Accordingly, the insulating layer 16 is located at the upper side of the insulating layer 14. The insulating layer 16 fills the thickness gap between the portion at which the coil pattern 20 is formed and the portion at which the coil pattern 20 is not formed. Therefore, at this stage, the surface (upper surface in FIG. 5D) of the insulating layer 16 is prevented from becoming uneven to some degree.

Figure 5E:
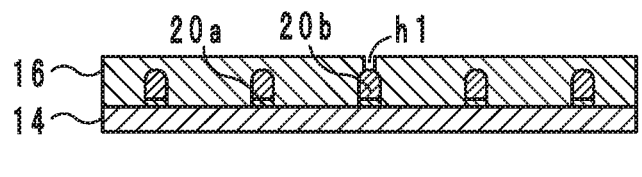
FIG. 5E is a sectional view showing a step of the manufacturing process of the multilayer substrate 10.
Figure 5E:
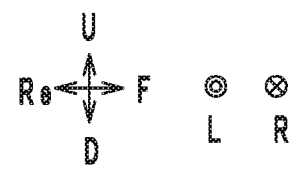

Next, as shown in FIG. 5E, laser beam irradiation is performed to form through-holes h1 and h2 (h2 not shown in the drawings) at the positions at which the via-hole conductors v1 and v2 are to be formed.

Figure 5F:
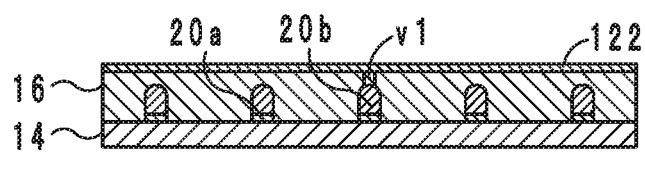
FIG. 5F is a sectional view showing a step of the manufacturing process of the multilayer substrate 10.
Figure 5F:
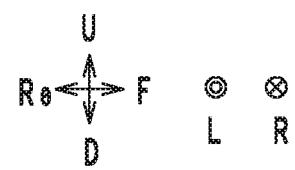

Next, as shown in FIG. 5F, a Cu foil 122, for example, is formed on the entire or substantially the entire upper surface of the insulating layer 16. At the same time, conductors are formed in the through-holes h1 and h2, and the via-hole conductors v1 and v2 are formed.

Figure 5G:
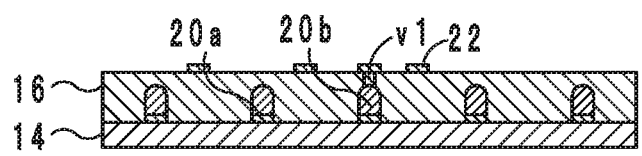
FIG. 5G is a sectional view showing a step of the manufacturing process of the multilayer substrate 10.
Figure 5G:
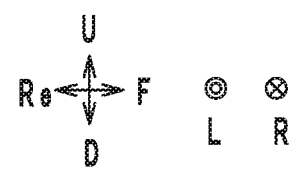

Next, as shown in FIG. 5G, the Cu foil 122 on the upper surface of the insulating sheet 16 is patterned, and thus, the coil pattern 22 is formed. Specifically, on the Cu foil 122, a resist having the same or substantially the same shape as the coil pattern 22 shown in FIG. 2 is printed. Next, the Cu 122 is etched, such that the portion of the Cu foil 122 uncovered with the resist is removed. Thereafter, the resist is removed. In this manner, the coil pattern 22 as shown in FIG. 2 is formed on the upper surface of the insulating layer 16.

Lastly, as shown in FIG. 4, epoxy resin is applied to cover the upper surface of the coil pattern 22 and the insulating layer 16, and thus, the protective layer 18 is formed. Since the protective layer 18 includes through-holes H1 and H2, the application of epoxy resin is preferably performed by screen printing, for example. Through the above-described process, the multilayer substrate 10 is produced.

The multilayer substrate 10 having the above-described structure is prevented from having unevenness on the upper or lower surface. More specifically, in the multilayer substrate 10, the coil pattern 22 is formed by patterning of the Cu foil 122. Accordingly, the coil pattern 22 has a uniform or substantially uniform thickness, and the thickness is smaller than the thickness of the coil pattern 20 including the plated layer 20b. Therefore, even when the coil pattern 20 and the coil pattern 22 are aligned in the up-down direction, the total thickness of these coil patterns 20 and 22 will not be excessively large. Thus, even when the area A1 at which the coil pattern 20 is disposed and the area A2 at which the coil pattern 22 is disposed overlap each other when viewed from above, the element assembly 12 does not have a large difference in thickness between the area at which the areas A1 and A2 overlap each other and the area at which the areas A1 and A2 do not overlap each other. Consequently, the multilayer substrate 10 is prevented from having unevenness on the upper or lower surface.

The multilayer substrate 10 is prevented from having unevenness on the upper or lower surface also for the following reason. The coil pattern 20 has a maximum thickness on the imaginary line LO. The coil pattern 22 has a uniform or substantially uniform thickness. Therefore, from the viewpoint of preventing unevenness on the upper or lower surface of the multilayer substrate 10, it is not preferable that the imaginary line LO overlaps the coil pattern 22. Especially if the imaginary line LO and the coil pattern 22 overlap in a portion in which the imaginary line LO and the coil pattern 22 run side by side, the element assembly 12 will have a large thickness in a large area. Therefore, in the multilayer substrate 10, the imaginary line LO does not overlap the coil pattern 22 in the portion in which the imaginary line LO and the coil pattern 22 run side by side. Thus, the multilayer substrate 10 is prevented from having unevenness on the upper or lower surface. However, this does not mean that it is always necessary to eliminate overlap of the imaginary line LO with the coil pattern 22 in the portion in which the imaginary line LO and the coil pattern 22 run side by side.

In the multilayer substrate 10, the coil pattern 20 does not overlap the coil pattern 22 in the portion where these coil patterns 20 and 22 run side by side. Therefore, the multilayer substrate 10 is further prevented from having unevenness on the upper or lower surface.

In the multilayer substrate 10, since the coil pattern has a large thickness, the coil pattern 20 has a low DC resistance value. Accordingly, the multilayer substrate 10 has a decreased conductor loss (transmission loss), and it becomes easy to obtain a coil with desired characteristics.

In the multilayer substrate 10, since the coil pattern has a small thickness, the coil pattern 22 has a greater conductor loss than the coil pattern 20. However, the small thickness of the coil pattern 22 contributes to the flatness of the multilayer substrate 10.

The above-described combination of the coil pattern 20 and the coil pattern 22 permits the multilayer substrate 10 to incorporate a coil with desired characteristics while maintaining its upper or lower surface flat.

When the coil patterns 20 and 22 define one coil, it is possible to obtain the above-described effects while achieving a predetermined inductance value.

Figure 6:
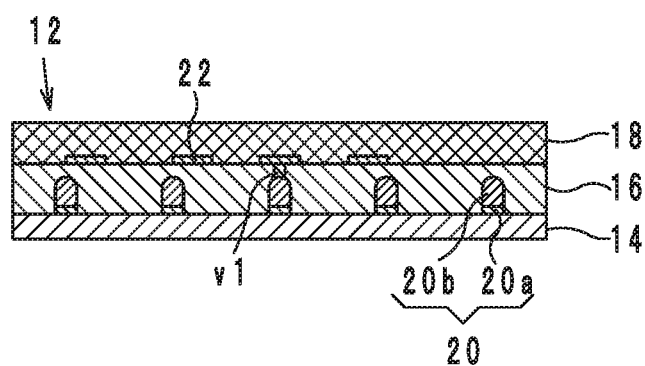
FIG. 6 is a sectional view of the multilayer substrate 10a along the line A-A in FIG. 3.
Figure 6:
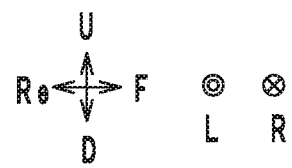

A multilayer substrate 10a according to a first modification of a preferred embodiment of the present invention will be described below in reference to the drawings. FIG. 6 is a sectional view of the multilayer substrate 10a along the line A-A in FIG. 3.

The multilayer substrate 10a differs from the multilayer substrate 10 in the line width of the coil pattern 22. The following description of the multilayer substrate 10a focuses on the difference.

The line width of the coil pattern 22 of the multilayer substrate 10a is greater than the line width of the coil pattern 22 of the multilayer substrate 10. Accordingly, in the multilayer substrate 10a, the line width of the coil pattern 20 is smaller than the line width of the coil pattern 20. When the multilayer substrate 10a is viewed from above, the coil pattern 20 and the coil pattern 22 overlap each other in a portion in which these coil patterns 20 and 22 extend side by side. There are no other structural differences between the multilayer substrate 10 and the multilayer substrate 10a, and no further description of the structure of the multilayer substrate 10a will be provided.

The multilayer substrate 10a having this structure is prevented from having unevenness on the upper or lower surface as in the case of the multilayer substrate 10.

In the multilayer substrate 10a, since the coil pattern has a large line width, the coil pattern 22 has a low DC resistance value. The thickness of the coil pattern 22 is not as large as the thickness of the coil pattern 20. Therefore, by increasing the line width of the coil pattern 22, it is possible to lower the DC resistance value of the coil.

Figure 7:
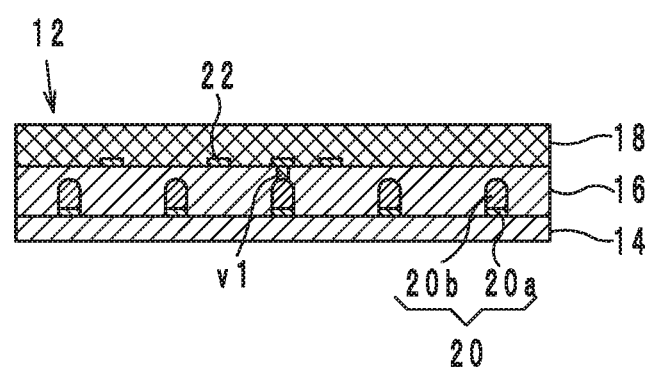
FIG. 7 is a sectional view of the multilayer substrate 10b along the line A-A in FIG. 3.
Figure 7:
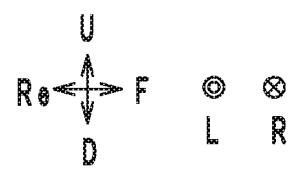

A multilayer substrate 10b according to a second modification of a preferred embodiment of the present invention will be described below in reference to the drawings. FIG. 7 is a sectional view of the multilayer substrate 10b along the line A-A in FIG. 3.

The multilayer substrate 10b differs from the multilayer substrate 10 in the materials of the insulating layers 14 and 16. The following description of the multilayer substrate 10b focuses on the difference.

In the multilayer substrate 10, the insulating layer 14 is preferably made of polyimide, for example, and the insulating layer 16 is preferably made of epoxy resin, for example. In the multilayer substrate 10b, however, the insulating layers 14 and 16 are preferably made of thermoplastic resin, such as liquid polymer, for example. It is preferable that the softening temperature of the insulating layer 16 is lower than the softening temperature of the insulating layer 14. However, the softening temperature of the insulating layer 16 may be higher than or may be equal or substantially equal to the softening temperature of the insulating layer 14. There are no other structural differences between the multilayer substrate 10 and the multilayer substrate 10b, and no further description of the structure of the multilayer substrate 10b will be provided.

Since the materials of the insulating layers 14 and 16 of the multilayer substrate 10b are different from the materials of the insulating layers 14 and 16 of the multilayer substrate 10, the multilayer substrate 10b is manufactured by a different method from the manufacturing method of the multilayer substrate 10. The manufacturing method of the multilayer substrate 10b will be described below with reference to the drawings. FIGS. 8A to 8E are sectional views showing the manufacturing process of the multilayer substrate 10b. FIGS. 5A to 5C will be used for a description of a step of forming the coil pattern 20 on the upper surface of the insulating layer 14 of the multilayer substrate 10b.

First, as shown in FIG. 5A, an insulating layer which is preferably made of liquid polymer and has an upper surface entirely or substantially entirely covered with a Cu foil 120a (an example of a metal film) is prepared as the insulating layer 14. The Cu foil 120a may be formed, for example, by providing a thin metal foil of Cu on the upper surface of the insulating layer 14 or by forming a metal film of Cu on the upper surface of the insulating layer 14 by plating or other suitable process.

Next, as shown in FIG. 5B, the Cu foil 120a on the upper surface of the insulating layer 14 is patterned, and thus, the underlayer conductor 20a is formed. Specifically, on the Cu foil 120a, a resist having the same or substantially the same shape as the coil pattern 20 is printed. Next, the Cu foil 120a is etched, and the portion of the Cu foil 120a uncovered with the resist is removed. Thereafter, the resist is removed. In this manner, the underlayer conductor 20a as shown in FIG. 2 is formed on the insulating layer 14.

Next, as shown in FIG. 5C, the plated layer 20b is formed by Cu electroplating with the underlayer conductor 20a used as a base electrode. Thus, the coil pattern 20 including the plated layer 20b is formed on the upper surface of the insulating layer 14.

Figure 8A:
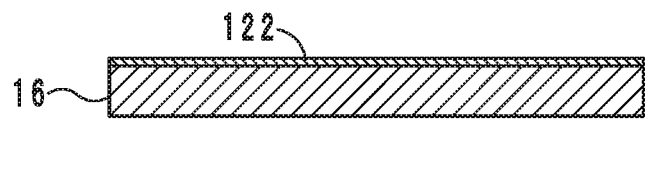
FIG. 8A is a sectional view showing a step of a manufacturing process of the multilayer substrate 10b.
Figure 8A:
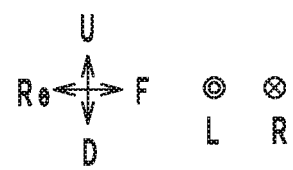

Next, as shown in FIG. 8A, an insulating layer which is preferably made of liquid polymer, for example, and includes an upper surface entirely or substantially entirely covered with a Cu foil 122 (an example of a metal film) is prepared as the insulating layer 16. The Cu foil 122 may be formed, for example, by providing a thin metal foil of Cu on the upper surface of the insulating layer 16 or by forming a metal film of Cu on the upper surface of the insulating layer 14 by plating or the like.

Figure 8B:
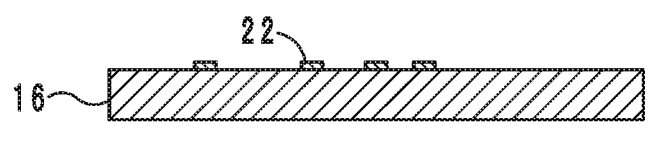
FIG. 8B is a sectional view showing a step of the manufacturing process of the multilayer substrate 10b.
Figure 8B:
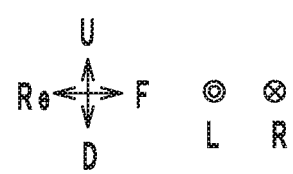

Next, as shown in FIG. 8B, the Cu foil 122 on the upper surface of the insulating layer 16 is patterned, and thus, the coil pattern 22 is formed. Specifically, on the Cu foil 122, a resist having the same or substantially the same shape as the coil pattern 22 is printed. Next, the Cu foil 122 is etched, and the portion of the Cu foil 122 uncovered with the resist is removed. Thereafter, the resist is removed. In this manner, the coil pattern 22 is formed on the insulating layer 16.

Figure 8C:
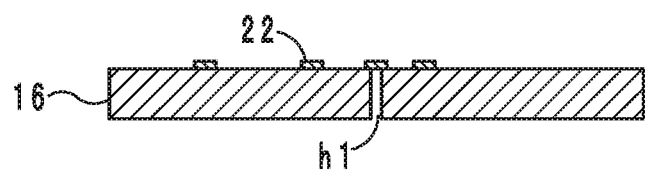
FIG. 8C is a sectional view showing a step of the manufacturing process of the multilayer substrate 10b.
Figure 8C:
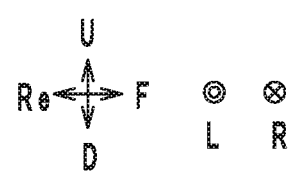

Next, as shown in FIG. 8C, laser beam irradiation is performed to form through-holes h1 and h2 (h2 not shown in the drawings) at the positions at which the via-hole conductors v1 and v2 are to be formed.

Figure 8D:
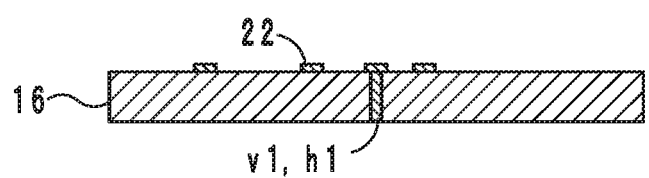
FIG. 8D is a sectional view showing a step of the manufacturing process of the multilayer substrate 10b.
Figure 8D:
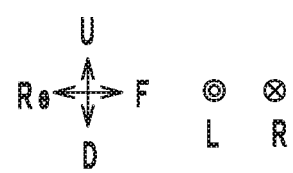

Next, as shown in FIG. 8D, a conductive paste mainly including a metal such as Cu, Sn, Ag or other suitable metal, for example, is filled in the through-holes h1 and h2.

Figure 8E:
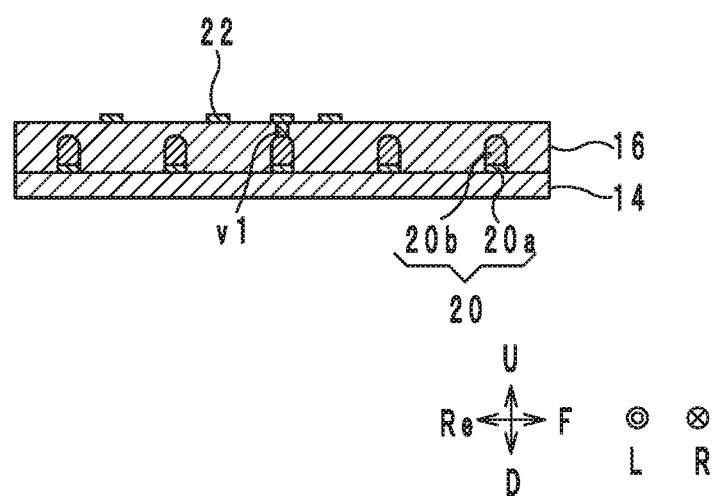
FIG. 8E is a sectional view showing a step of the manufacturing process of the multilayer substrate 10b.

Next, as shown in FIG. 8E, the insulating layer 16 is placed on the upper surface of the insulating 14, and a heat treatment and a pressure treatment are applied to the insulating layers 14 and 16. The heating temperature is preferably higher than the softening temperature of the insulating layer 16 and lower than the softening temperature of the insulating layer 14. Thus, the insulating layer 16 is softened by the heat treatment and enters the gaps between the lines of the coil pattern 20. Thereafter, the insulating layers 14 and 16 are cooled. Thus, the insulating layer 14 is solidified, and the insulating layers 14 and 16 are unified into one body. Also, the conductive paste in the through-holes h1 and h2 is solidified by heat, and the via-hole conductors v1 and v2 are formed. In this case also, the insulating layer 16 fills the thickness gap between the portion at which the coil pattern 20 is formed and the portion at which the coil pattern 20 is not formed. Therefore, at this stage, the surface of the insulating layer 16 is prevented from becoming uneven to some degree.

Lastly, as shown in FIG. 7, epoxy resin is applied to cover the upper surface of the coil pattern 22 and the insulating layer 16, except for the portions of the external electrodes 24 and 26, and thus, the protective layer 18 is formed. Since the protective layer 18 includes through-holes H1 and H2, the application of epoxy resin is preferably performed by screen printing. Through the above-described process, the multilayer substrate 10b is produced.

The multilayer substrate 10b having this structure is prevented from having unevenness on the upper or lower surface as in the case of the multilayer substrate 10.

In the multilayer substrate 10b, also, deformation of the coil pattern 20 is able to be prevented. More specifically, the heating temperature for the pressure boding between the insulating layer 14 and the insulating layer 16 is lower than the softening temperature of the insulating layer 14. Therefore, the insulating layer 14 is prevented from softening and changing shape. Consequently, the coil pattern 20 disposed on the upper surface of the insulating layer 14 is prevented from deforming.

In the multilayer substrate 10b, short circuits between lines of the coil pattern 20 are prevented. More specifically, the heating temperature for the pressure bonding between the insulating layer 14 and the insulating layer 16 is higher than the softening temperature of the insulating layer 16. Accordingly, the insulating layer 16 is softened by the heat treatment and enters the gaps between the lines of the coil pattern 20. This prevents short circuits between lines of the coil pattern 20.

Figure 9:
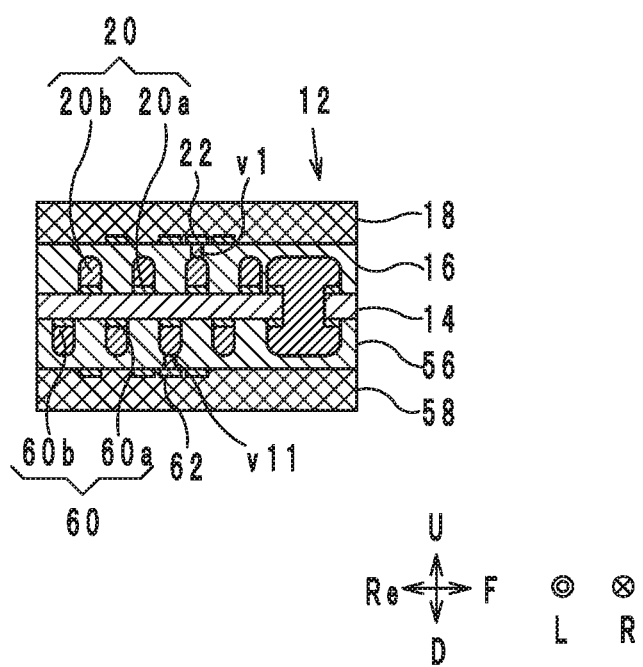
FIG. 9 is a sectional view of a multilayer substrate 10c according to a preferred embodiment of the present invention.

A multilayer substrate 10c according to a third modification of a preferred embodiment of the present invention will be described below with reference to the drawings. FIG. 9 is a sectional view of the multilayer substrate 10c.

The multilayer substrate 10c differs from the multilayer substrate 10 in that the multilayer substrate 10c further includes an insulating layer 56, a protective layer 58, coil patterns 60 and 62, and via-hole conductors v11 to v13 (the via-hole conductors v12 and v13 not shown in the drawings). The following description of the multilayer substrate 10c focuses on the difference.

In the element assembly 12, the protective layer 58, the insulating layers 56, 14 and 16, and the protective layer 18 are stacked in layers from bottom to top in this order. Thus, the insulating layer 56 (an example of a third insulating layer) is located at the lower side of the insulating layer 14 (an example of a second side of the first insulating layer with respect to the layer stacking direction). The insulating layer 56 and the protective layer 58 are made of epoxy resin.

The insulating layers 14 and 16, the protective layer 18, the coil patterns 20 and 22, and the external electrodes 24 and 26 of the multilayer substrate 10c are the same or substantially the same as the insulating layers 14 and 16, the protective layer 18, the coil patterns 20, 22, and the external electrodes 24 and 26 of the multilayer substrate 10, and these members of the multilayer substrate 10c will not be described.

The coil pattern 60 (an example of a third coil pattern) is disposed on the lower surface of the insulating layer 14. When viewed from above, the coil pattern 60 spirals from outside inward in counterclockwise turns (and thus has a two-dimensional spiral shape). When viewed from above, the area at which the coil pattern 60 is disposed overlaps the area at which the coil pattern 20 is disposed. However, the lines of the coil pattern 20 and the lines of the coil pattern 60 are alternately arranged from inside outward, and these lines do not overlap one another. It is not necessarily required to completely eliminate overlap of the lines of the coil pattern 20 with the lines of the coil pattern 60, and when viewed from above, the coil pattern 20 and the coil pattern 60 may cross each other. The outer end portion of the coil pattern 20 and the outer end portion of the coil pattern 60 extend through the insulating layer 14 and thus are connected to each other.

The coil pattern 60 includes an underlayer conductor 60a and a plated layer 60b. The underlayer conductor 60a and the plated layer 60b are similar to the underlayer conductor 20a and the plated layer 20b, respectively, and the underlayer conductor 60a and the plated layer 60b will not be described.

A coil pattern 62 (an example of a fourth coil pattern) is disposed on the lower surface of the insulating layer 56. When viewed from above, the coil pattern 62 spirals from inside outward in counterclockwise turns (and thus has a two-dimensional spiral shape). When viewed from above, the area in which the coil pattern 62 is disposed (an example of a fourth area) overlaps the areas in which the coil patterns 20, 22 and 60 are disposed. (The area in which the coil pattern 60 is disposed is an example of a third area.) The maximum thickness of the coil pattern 62 is smaller than the maximum thickness of the coil pattern 60. There are no other structural differences between the coil pattern 62 and the coil pattern 22, and a further detailed description of the coil pattern 62 will be omitted.

The via-hole conductor v1 extends through the insulating layer 16 in the up-down direction to connect the inner end of the coil pattern 20 and the inner end of the coil pattern 22.

The via-hole conductor v11 pierces through the insulating layer 56 in the up-down direction to connect the inner end of the coil pattern 60 and the inner end of the coil pattern 62.

The via-hole conductor v12 (not shown in the drawings) extends through the protective layer 18 in the up-down direction to connect the outer end of the coil pattern 22 and the external electrode 26.

The via-hole conductor v13 (not shown in the drawings) extends through the insulating layers 56, 14 and 16 and the protective layer 18 in the up-down direction to connect the outer end of the coil pattern 62 and the external electrode 26.

In the multilayer substrate 10c, the coil pattern 20, the coil pattern 22, the coil pattern 60 and the coil pattern 62 are electrically connected in series in this order.

Figure 10A:
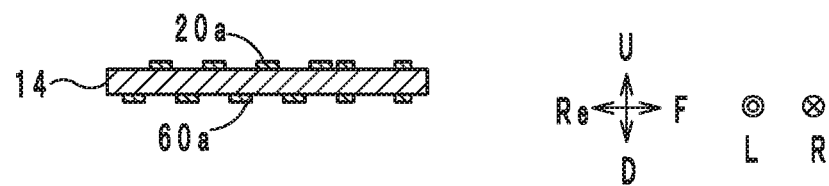
FIG. 10A is a sectional view showing a step of a manufacturing process of the multilayer substrate 10c.
Figure 10B:
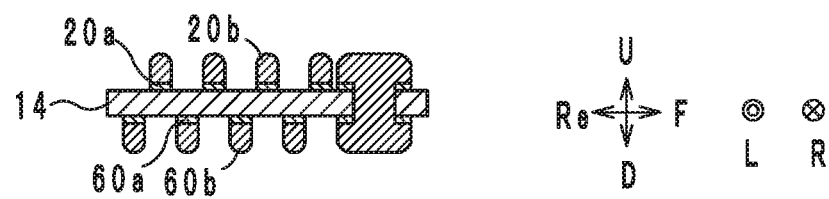
FIG. 10B is a sectional view showing a step of the manufacturing process of the multilayer substrate 10c.
Figure 10C:
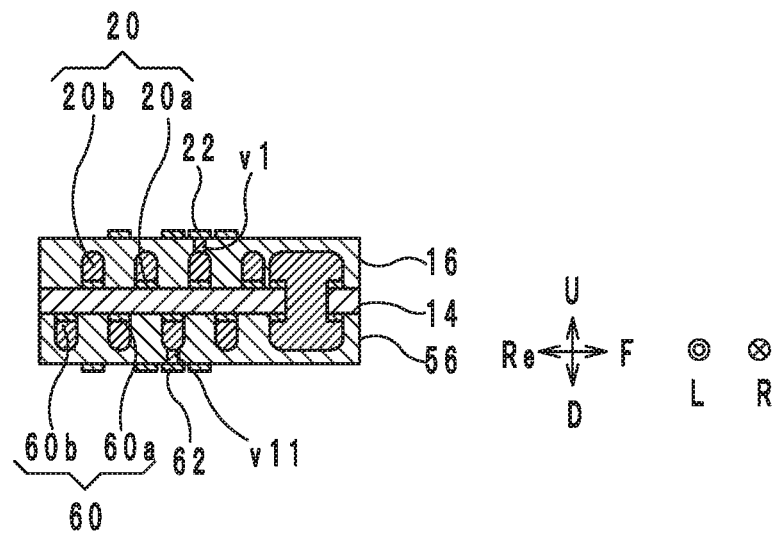
FIG. 10C is a sectional view showing a step of the manufacturing process of the multilayer substrate 10c.

Next, a manufacturing method of the multilayer substrate 10c according to a preferred embodiment of the present invention will be described below in reference to the drawings. FIGS. 10A to 10C are sectional views showing a manufacturing process of the multilayer substrate 10c.

The manufacturing method of the multilayer substrate 10c is substantially the same as the manufacturing method of the multilayer substrate 10. However, in the manufacturing process of the multilayer substrate 10c, the structure above the insulating layer 14 and the structure below the insulating layer 14 are formed at the same time.

First, as shown in FIG. 10A, the underlayer conductors 20a and 60a are formed on the upper and lower surfaces of the insulating layer 14, respectively. Next, as shown in FIG. 10B, after a through-hole extending through the insulating layer 14 in the up-down direction is formed, the plated layers 20b and 60b are formed. In this manner, the coil patterns 20 and 60 are formed. This process is the same or substantially the same as the process described in reference to FIGS. 5A to 5C.

Thereafter, the insulating layer 16 is formed on the upper surface of the insulating layer 14, and at the same time, the insulating layer 56 is formed on the lower surface of the insulating layer 14. Next, as shown in FIG. 10C, the coil patterns 22 and 62, and the via-hole conductors v1, v11 to v13 are formed. This process is the same or substantially the same as the process described in reference to FIGS. 5D to 5G.

Lastly, as shown in FIG. 9, epoxy resin is applied to cover the coil pattern 22 and the upper surface of the insulating layer 16, and thus, the protective layer 18 is formed. At the same time, epoxy resin is applied to cover the coil pattern 62 and the lower surface of the insulating layer 56, and thus, the protective layer 58 is formed. Through the process described above, the multilayer substrate 10c is produced.

In the multilayer substrate 10c having the above-described structure, the coil patterns 20 and 22 are positioned at the upper side of the insulating layer 14, and the coil patterns 60 and 62 are positioned at the lower side of the insulating layer 14. The coil patterns 60 and 62 have the same or substantially the same structures as the coil patterns 20 and 22, respectively. Specifically, the coil pattern 60 includes the plated layer 60b. The maximum thickness of the coil pattern 62 is smaller than the maximum thickness of the coil pattern 60. Accordingly, the multilayer substrate 10c, in which the coil pattern 20 with the plated layer 20b and the coil pattern 60 with the plated layer 60b are formed on the upper and lower surfaces of the insulating layer 14, respectively, is prevented from having unevenness on the upper or lower surface, as in the case of the multilayer substrate 10.

In the multilayer substrate 10c, the lines of the coil pattern 20 and the lines of the coil pattern 60 are alternately arranged from inside outward without overlapping each other. This prevents the multilayer substrate 10c from having unevenness on the upper or lower surface. The lines of the coil pattern 20 and the lines of the coil pattern 60 may partially overlap in the line width direction. However, it is preferable that the maximum-thickness portion of the coil pattern 20 and the maximum-thickness portion of the coil pattern 60 do not overlap each other when viewed from above.

Figure 11:
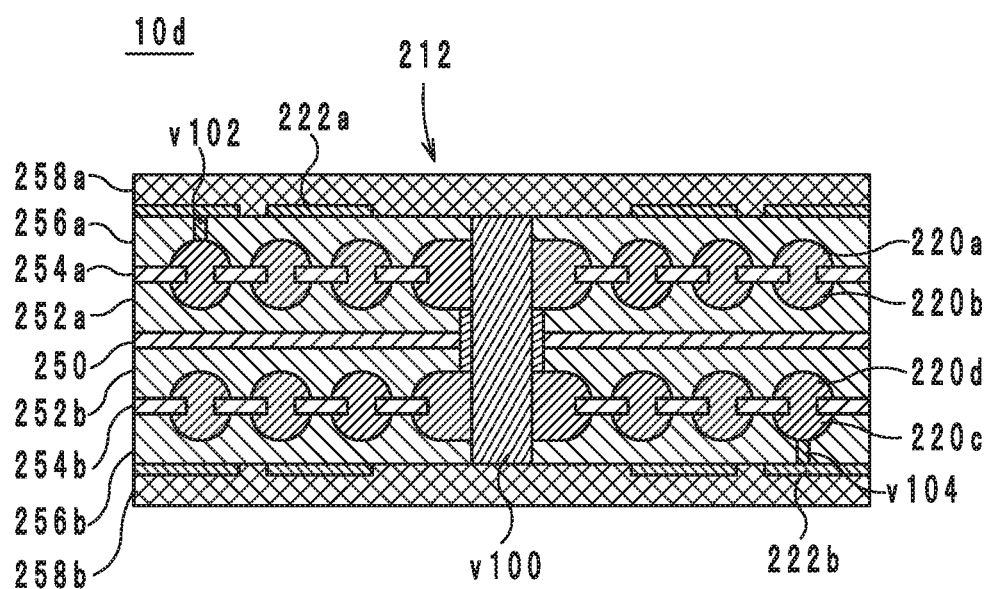
FIG. 11 is a sectional view of a multilayer substrate 10d according to a preferred embodiment of the present invention.
Figure 11:
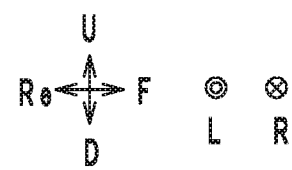

A multilayer substrate 10d according to a fourth modification of a preferred embodiment of the present invention will be described below with reference to the drawings. FIG. 11 is a sectional view of the multilayer substrate 10d.

As shown in FIG. 11, the multilayer substrate 10d includes an element assembly 212, coil patterns 220a, 220b, 220c and 220d, and via-hole conductors v100, v102 and v104.

The element assembly 212 is preferably a plate-shaped member with a rectangular or substantially rectangular shape when viewed from above, and is flexible. The element assembly 212 includes insulating layers 250, 252a, 252b, 254a, 254b, 256a and 256b, and protective layers 258a and 258b. The protective layer 258b, the insulating layers 256b, 254b, 252b, 250, 252a, 254a and 256a, and the protective layer 258a are stacked in layers from bottom to top in this order.

The coil pattern 220a is disposed on the upper surface of the insulating layer 254a, and has a spiral shape when viewed from above. The coil pattern 220b is disposed on the lower surface of the insulating layer 254a, and has a spiral shape when viewed from above. The coil pattern 220a and the coil pattern 220b have the same or substantially the same shape and completely or substantially completely overlap each other, when viewed from above. The insulating layer 254a includes a through-hole. The through-hole has a spiral shape that overlaps the coil patterns 220a and 220b when viewed from above. Accordingly, the coil pattern 220a and the coil pattern 220b are connected to each other across the entire or substantially the entire length. These coil patterns 220a and 220b are preferably plated layers grown by electroplating, for example.

The coil pattern 220c is disposed on the lower surface of the insulating layer 254b, and has a spiral shape when viewed from above. The coil pattern 220d is disposed on the upper surface of the insulating layer 254b, and has a spiral shape when viewed from above. The coil pattern 220c and the coil pattern 220d have the same or substantially the same shape and completely or substantially completely overlap each other, when viewed from above. The insulating layer 254b includes a through-hole. The through-hole has a spiral shape overlapping the coil patterns 220c and 220d when viewed from above. Accordingly, the coil pattern 220c and the coil pattern 220d are connected to each other across the entire or substantially the entire length. These coil patterns 220c and 220d are preferably plated layers grown by electroplating, for example.

The via-hole conductor v100 extends through the insulating layers 256a, 254a, 252a, 250, 252b, 254b and 256b in the up-down direction. The via-hole conductor v100 connects the respective inner ends of the coil patterns 220a to 220d. Thus, the coil patterns 220a and 220b and the coil patterns 220c and 220d are electrically connected in series.

The coil pattern 222a is disposed on the upper surface of the insulating layer 256a, and has a spiral shape when viewed from above. The coil pattern 222a has a uniform or substantially uniform thickness. The maximum thickness of the coil pattern 222a is smaller than the maximum thickness of the coil pattern 220a and smaller than the maximum thickness of the coil pattern 220b.

The coil pattern 222b is disposed on the lower surface of the insulating layer 256b, and has a spiral shape when viewed from above. The coil pattern 222b has a uniform or substantially uniform thickness. The maximum thickness of the coil pattern 222b is smaller than the maximum thickness of the coil pattern 220c and smaller than the maximum thickness of the coil pattern 220d. Each of the coil patterns 222a and 222b is preferably formed by patterning of a conductor layer of Cu or other suitable material, for example.

The via-hole conductor v102 extends through the insulating layer 256a in the up-down direction to connect the outer end of the coil pattern 220a and the outer end of the coil pattern 222a.

The via-hole conductor v104 extends through the insulating layer 256b in the up-down direction to connect the outer end of the coil pattern 220c and the outer end of the coil pattern 222b.

In the multilayer substrate 10d, the coil pattern 222a, the coil patterns 220a and 220b, the coil patterns 220c and 220d, and the coil pattern 222b are electrically connected in series in this order.

A manufacturing method of the multilayer substrate 10d according to a preferred embodiment of the present invention will be described below in reference to the drawings. FIGS. 12A to 12F are sectional views showing a manufacturing process of the multilayer substrate 10d. In the following, a case of manufacturing one multilayer substrate 10d will be described as an example. Practically, however, large-sized insulating sheets are stacked and cut, and thus, a plurality of multilayer substrates 10d are manufactured at a time.

Figure 12A:
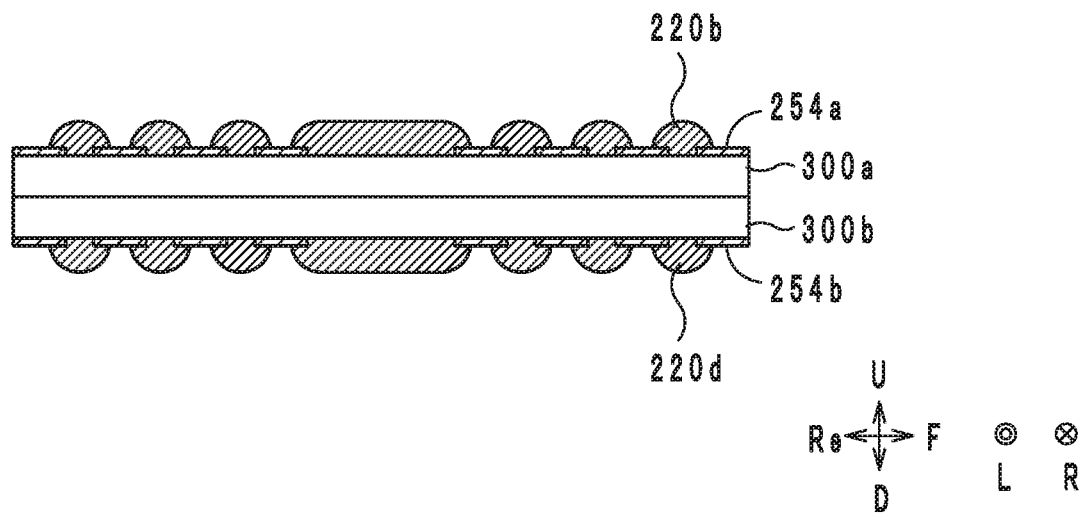
FIG. 12A is a sectional view showing a step of a manufacturing process of the multilayer substrate 10d.

First, as shown in FIG. 12A, the insulating layer 254a is preferably formed on the upper surface of a base plate 300a made of a material including Cu, Al or other suitable material, for example, and the insulating layer 254b is formed on the lower surface of a base plate 300b. The coil pattern 220b is formed on the portion of the upper surface of the base plate 300a uncovered by the insulating layer 254a by electroplating, and the coil pattern 220d is formed on the portion of the lower surface of the base plate 300b uncovered by the insulating layer 254b by electroplating. Since the base plates 300a and 300b preferably include Cu, Al or other suitable material, for example, the coil patterns 220b and 220d are able to be formed as plated layers.

Figure 12B:
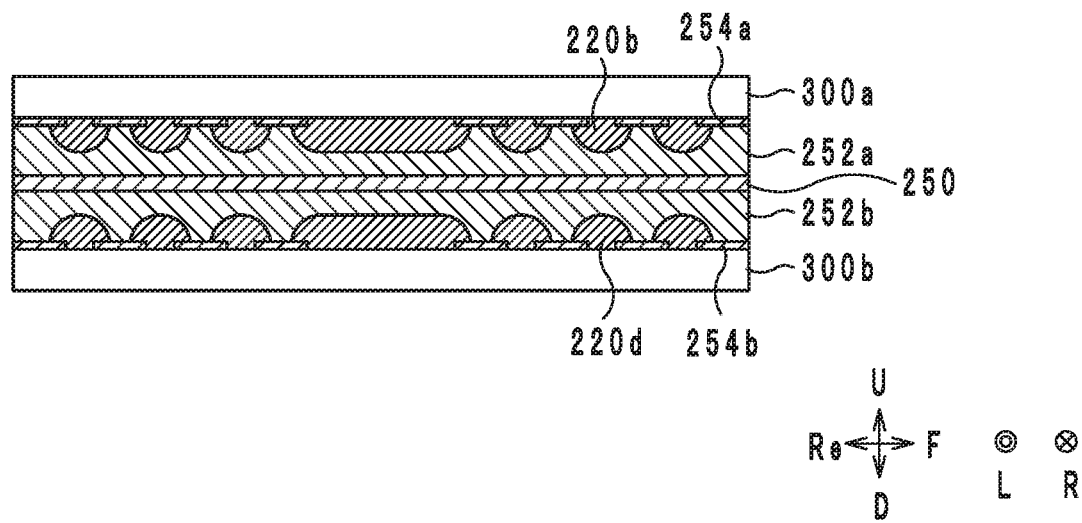
FIG. 12B is a sectional view showing a step of the manufacturing process of the multilayer substrate 10d.

Next, as shown in FIG. 12B, the base plates 300a and 300b are separated from each other. Thereafter, the insulating layer 252a is formed to cover the insulating layer 254a and the coil pattern 220b. In the same or substantially the same manner, the insulating layer 252b is formed to cover the insulating layer 254b and the coil pattern 220b. Then, the insulating layer 252a and the insulating layer 252b are bonded together by the insulating layer 250.

Figure 12C:
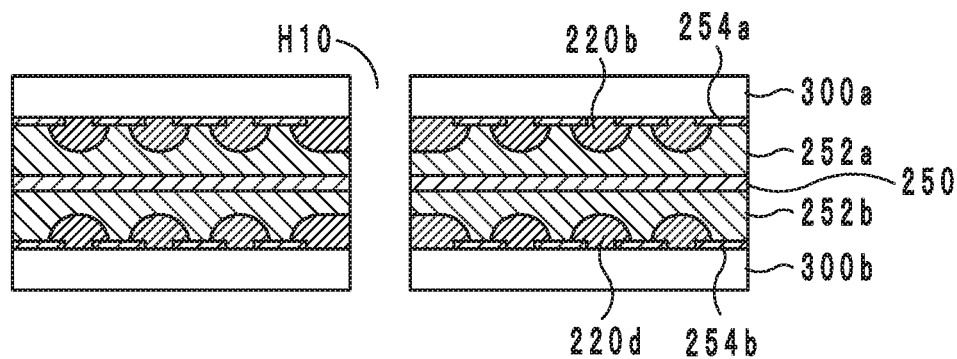
FIG. 12C is a sectional view showing a step of the manufacturing process of the multilayer substrate 10d.
Figure 12C:
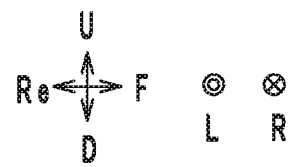

Next, as shown in FIG. 12C, a through-hole H10 extending through the base plates 300a and 300b, and the insulating layers 250, 254a and 254b in the up-down direction is formed.

Figure 12D:
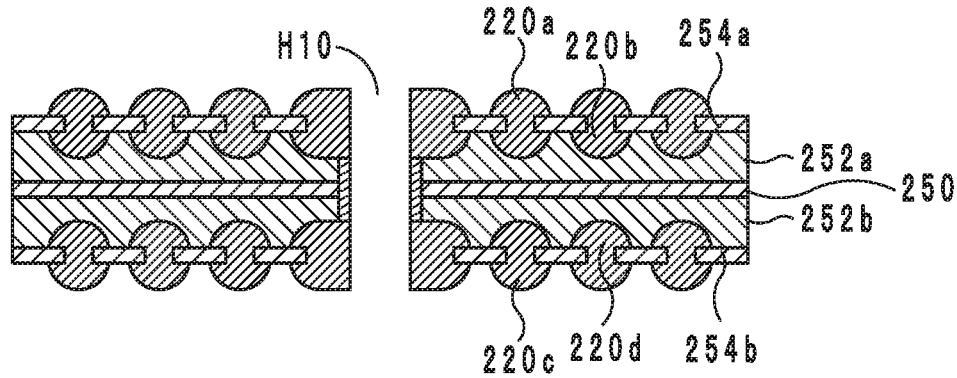
FIG. 12D is a sectional view showing a step of the manufacturing process of the multilayer substrate 10d.
Figure 12D:
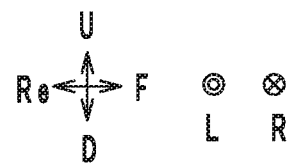

Next, as shown in FIG. 12D, the base plates 300a and 300b are removed. Thereafter, the stack of insulating layers 250, 254a and 254b and coil patterns 220b and 220d is immersed in a chemical solution including palladium salt or any other metallic catalyst, and thus, the metallic catalyst is adsorbed onto the inner surface of the through-hole H10. In this regard, it is preferable to provide films, for example, on the upper surface of the insulating layer 254a and on the lower surface of the insulating layer 254b to prevent the metallic catalyst from being adsorbed onto the upper surface of the insulating layer 254a and onto the lower surface of the insulating layer 254b. Thus, the films are peeled off, and electroplating is performed. Thus, the coil patterns 220a and 220c are formed on the coil patterns 220b and 220d, respectively.

Figure 12E:
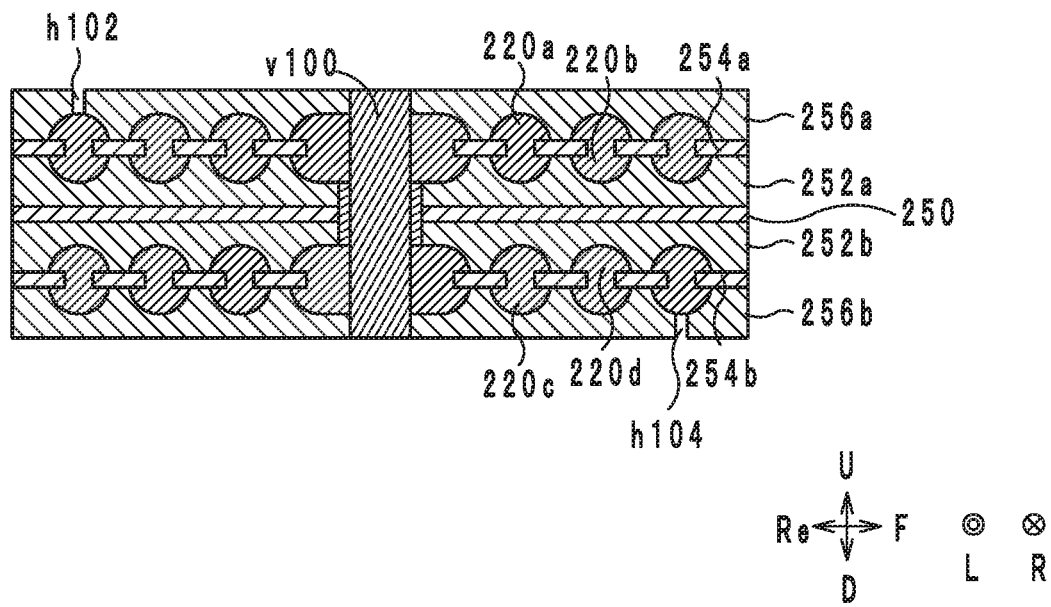
FIG. 12E is a sectional view showing a step of the manufacturing process of the multilayer substrate 10d.

Next, as shown in FIG. 12E, the insulating layer 256a is formed to cover the upper surface of the insulating layer 254a and the coil pattern 220a, and the insulating layer 256b is formed to cover the lower surface of the insulating layer 254b and the coil pattern 220c. Further, through-holes h102 and h104 are formed in the insulating layers 256a and 256b, respectively, at positions at which the via-hole conductors v102 and v104 are to be formed. The through-holes h102 and h104 may preferably be formed, for example, by laser beam irradiation.

Figure 12F:
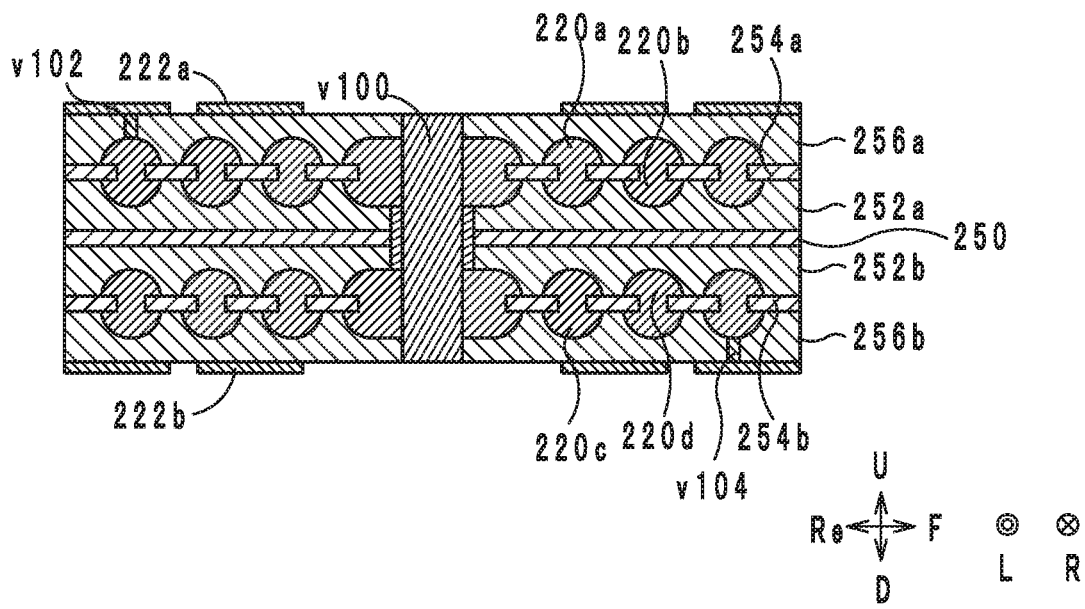
FIG. 12F is a sectional view showing a step of the manufacturing process of the multilayer substrate 10d.

Next, as shown in FIG. 12F, a conductor layer covering the entire or substantially the entire upper surface of the insulating layer 254a and a conductor layer covering the entire or substantially the entire lower surface of the insulating layer 254b are formed, for example, by plating. At the time, conductors are formed in the through-holes h102 and h104, and thus, the via-hole conductors v102 and v104 are formed. Thus, the conductor layers are etched with resists having the same or substantially the same shapes as the coil patterns 222a and 222b stuck thereon (that is, are patterned), and thus, the coil patterns 222a and 222b are formed.

Lastly, the protective layer 258a is formed to cover the upper surface of the insulating layer 256a and the coil pattern 222a, and the protective layer 258b is formed to cover the lower surface of the insulating layer 256b and the coil pattern 222b. Through the process above, the multilayer substrate 10d is produced The multilayer substrate 10d having the above-described structure is prevented from having unevenness on the upper or lower surface. Now, a multilayer substrate which differs from the multilayer substrate 10d only in that the coil patterns 222a and 222b are plated layers grown by electroplating is described as a comparative example. In the multilayer substrate of the comparative example, the coil patterns corresponding to the coil patterns 222a and 222b are referred to as coil patterns 322a and 322b, respectively. The other elements and members of the multilayer substrate of the comparative example are provided with the same reference symbols as provided to those elements and members of the multilayer substrate 10d.

In the multilayer substrate of the comparative example, six plated coil patterns 220a to 220d, 322a and 322b are stacked on one another. Since the coil patterns 220a to 220d, 322a and 322b are plated layers grown by electroplating, the coil patterns 220a to 220d, 322a and 322b have large thicknesses, and the upper or lower surface of the element assembly 212 is likely to become uneven. Especially, due to the coil patterns 322a and 322b, the upper or lower surface of the element assembly 212 is likely to become uneven.

In the multilayer substrate 10d, however, the coil patterns 222a and 222b are conductor layers having a uniform or substantially uniform thickness and are formed by patterning. Therefore, the thicknesses of the coil patterns 222a and 222b are smaller than the thicknesses of the coil patterns 322a and 322b. Accordingly, in the multilayer substrate 10d, the upper or lower surface is unlikely to become uneven, as compared to the comparative example.

As described above, in the multilayer substrate 10d, above and below the insulating layer 250, the coil patterns 220a and 220b are grown by plating from the same position, and the coil patterns 220c and 220d are grown by plating from the same position. In such a structure, the coil patterns 220a, 220b, 220c and 220d have large cross-sectional areas and have low DC resistance values. However, the coil patterns 220a, 220b, 220c and 220d overlap one another when viewed from above, and it is likely to cause the upper and lower surfaces of the multilayer substrate 10d to have great unevenness. Therefore, the coil patterns 222a and 222b are formed to reduce or prevent the unevenness.

Figure 13:
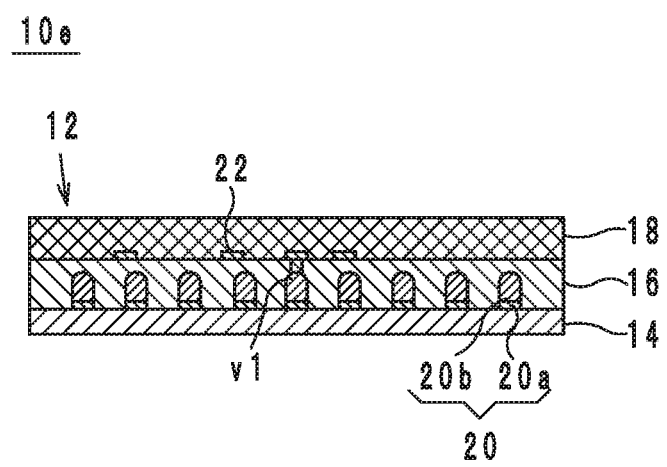
FIG. 13 is a sectional view of the multilayer substrate 10e along the line A-A in FIG. 3.
Figure 13:
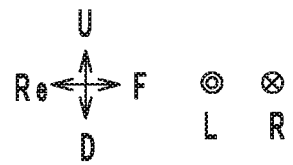

A multilayer substrate 10e according to a fifth modification of a preferred embodiment of the present invention will be described below in reference to the drawings. FIG. 13 is a sectional view of the multilayer substrate 10e along the line A-A in FIG. 3.

The multilayer substrate 10e differs from the multilayer substrate 10 in the distance between radially adjacent portions (which will hereinafter be referred to as an interval between lines) of the coil pattern 20. The following description of the multilayer substrate 10e focuses on the difference.

As shown in FIG. 13, the interval between lines of the coil pattern 20 is smaller than the interval between lines of the coil pattern 22. Since the coil pattern 20 includes a plated layer, the coil pattern 20 is able to be provided with a small pitch. Accordingly, it is possible to increase the length and/or the number of turns of the coil pattern 20 and thus to increase the inductance value of the coil pattern 20.

As in the case of the multilayer substrate 10, the multilayer substrate 10e having this structure is prevented from unevenness on the upper or lower surface.

Multilayer substrates and manufacturing methods of multilayer substrates according to preferred embodiments of the present invention are not limited to the multilayer substrates 10, 10a to 10e and the manufacturing methods of the multilayer substrates 10, 10a to 10e, and various changes and modifications are possible within the scope of the present invention.

The elements of the multilayer substrates 10, 10a to 10e and the manufacturing methods of the multilayer substrates 10, 10a to 10e may be combined arbitrarily.

In reference to FIG. 3, when viewed from above, the imaginary line L0 does not overlap the coil pattern 22 in the portion at which the imaginary line L0 and the coil pattern 22 run side by side. When viewed from above, the outermost portion of the imaginary line LO may overlap the coil pattern 22.

Each of the coil patterns 20 and 22 preferably has a spiral shape. The coil patterns 20 and 22 may have a helical or three-dimensional spiral shape. In this specification, the concept of a spiral shape includes a two-dimensional spiral shape and a three-dimensional spiral shape.

Preferably, at least a portion of the area A1 overlaps at least a portion of the area A2, and therefore, the entire or substantially the entire area A1 may overlap the entire or substantially the entire area A2.

As described above, preferred embodiments of the present invention are useful for multilayer substrates and manufacturing methods of multilayer substrates, and are excellent especially in preventing the multilayer substrates from having unevenness on principal surfaces.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
    an element assembly including a first insulating layer and a second insulating layer which are stacked in layers in a layer stacking direction such that the second insulating layer is located at a first side of the first insulating layer with respect to the layer stacking direction;
    a first coil pattern disposed on a first principal surface of the first insulating layer that is on the first side of the first insulating layer with respect to the layer stacking direction; and
    a second coil pattern disposed on a first principal surface of the second insulating layer that is on a first side of the second insulating layer with respect to the layer stacking direction; wherein
    each of the first coil pattern and the second coil pattern has a two-dimensional spiral shape including turns when viewed from the layer stacking direction;
    when viewed from the layer stacking direction, at least a portion of a first area in which the first coil pattern is disposed and a second area in which the second coil pattern is disposed overlap each other;
    a maximum thickness of the second coil pattern is smaller than a maximum thickness of the first coil pattern;
    when viewed from the layer stacking direction, the second coil pattern includes an overlapping portion which overlaps the first coil pattern or includes a portion which is located between two radially adjacent portions of the first coil pattern;
    an imaginary line is defined by connecting points at which a thickness of the first coil pattern reaches a maximum in cross-sectional views of the first coil pattern along lines perpendicular to a direction in which the first coil pattern extends;
    when viewed from the layer stacking direction, there is no portion in which the imaginary line overlaps the second coil pattern in a portion in which the imaginary line extends side by side with the second coil pattern;
    when viewed from the layer stacking direction, the second area is within the first area;
    when viewed from the layer stacking direction, an outermost ring of the first coil pattern does not overlap with an outermost ring of the second coil pattern;
    the first coil pattern includes an underlayer conductor disposed on the first principal surface of the first insulating layer and a plated layer disposed on the underlayer conductor; and
    the second coil pattern is defined by only a single conductor layer.

2. The multilayer substrate according to claim 1, wherein non-uniformity of the second coil pattern in a dimension in the layer stacking direction is smaller than non-uniformity of the first coil pattern in a dimension in the layer stacking direction.

3. The multilayer substrate according to claim 1, wherein the first coil pattern and the second coil pattern are electrically connected to each other.

4. The multilayer substrate according to claim 1, wherein
    the element assembly further includes a third insulating layer which is stacked to be located at a second side of the first insulating layer with respect to the layer stacking direction;
    the multilayer substrate further includes:
    a third coil pattern disposed on a second principal surface of the first insulating layer that is on the second side of the first insulating layer with respect to the layer stacking direction; and
    a fourth coil pattern disposed on a second principal surface of the third insulating layer that is on a second side of the third insulating layer with respect to the layer stacking direction;
    when viewed from the layer stacking direction, at least a portion of a third area in which the third coil pattern is disposed and at least a portion of a fourth area in which the fourth coil pattern is disposed overlap each other; and
    a maximum thickness of the fourth coil pattern is smaller than a maximum thickness of the third coil pattern.

* * * * *